United States Patent
Christensen et al.

(10) Patent No.: US 10,020,784 B1
(45) Date of Patent: Jul. 10, 2018

(54) BROADBAND DIFFERENTIAL TRANS-IMPEDANCE AMPLIFIER (TIA)

(71) Applicant: Mellanox Technologies Denmark Aps, Roskilde (DK)

(72) Inventors: Kenn Christensen, Roskilde (DK); Steen Bak Christensen, Roskilde (DK)

(73) Assignee: MELLANOX TECHNOLOGIES DENMARK APS, Roskilde (DK)

( * ) Notice: Subject to any disclaimer, the term of this patent is extended or adjusted under 35 U.S.C. 154(b) by 0 days.

(21) Appl. No.: 15/442,801

(22) Filed: Feb. 27, 2017

(51) Int. Cl.
*H03F 3/08* (2006.01)
*H03F 3/45* (2006.01)

(52) U.S. Cl.
CPC ............. *H03F 3/45475* (2013.01); *H03F 2203/45022* (2013.01); *H03F 2203/45288* (2013.01)

(58) Field of Classification Search
CPC .................................. H03F 3/08; H03F 3/45
USPC ................. 330/69, 308; 250/214 A, 214 AG
See application file for complete search history.

(56) References Cited

U.S. PATENT DOCUMENTS

| 6,720,827 B2 | 4/2004 | Yoon |
| 2015/0086221 A1 | 3/2015 | Shringarpure et al. |
| 2017/0093525 A1* | 3/2017 | Navid ............... H04L 1/0036 |
| 2017/0207760 A1* | 7/2017 | Werking ............ H03F 3/45475 |

* cited by examiner

*Primary Examiner* — Steven J Mottola
(74) *Attorney, Agent, or Firm* — D. Kligler IP Services Ltd.

(57) ABSTRACT

A TIA includes first and second input terminals for differentially receiving an input current signal, and first and second amplification circuits. The first amplification circuit includes a first Alternating-Current (AC) path and a first Direct-Current (DC) path that are configured to amplify in parallel respective first AC and DC components of the input current signal flowing via the first input terminal, and a first combiner configured to sum the amplified first AC and DC components. The second amplification circuit includes a second AC path and a second DC path that are configured to amplify in parallel respective second AC and DC components of the input current signal flowing via the second input terminal, and a second combiner configured to sum the amplified second AC and DC components. First and second output terminals are configured for outputting an output voltage signal formed between outputs of the first and second combiners.

18 Claims, 2 Drawing Sheets

BROADBAND DIFFERENTIAL TRANS-IMPEDANCE AMPLIFIER (TIA)

FIELD OF THE INVENTION

The present invention relates generally to amplification circuits, and particularly to Trans-Impedance Amplifiers (TIAs).

BACKGROUND OF THE INVENTION

TIAs are used for amplification in a variety of applications that require current-to-voltage conversion. One example application is amplifying the current produced by a photo-detector such as a light-sensitive Positive-Intrinsic-Negative (PIN) diode.

SUMMARY OF THE INVENTION

An embodiment of the present invention that is described herein provides a TIA including first and second input terminals for differentially receiving an input current signal, first and second amplification circuits, and first and second output terminals. The first amplification circuit includes a first Alternating-Current (AC) path and a first Direct-Current (DC) path that are configured to amplify in parallel respective first AC and DC components of the input current signal flowing via the first input terminal, and a first combiner configured to sum the amplified first AC and DC components. The second amplification circuit includes a second AC path and a second DC path that are configured to amplify in parallel respective second AC and DC components of the input current signal flowing via the second input terminal, and a second combiner configured to sum the amplified second AC and DC components. The first and second output terminals are configured for outputting an output voltage signal formed between outputs of the first and second combiners.

In some embodiments, the first AC path and the first DC path are gain-matched to one another, and the second AC path and the second DC path are gain-matched to one another. In some embodiments, the TIA includes a differential voltage amplifier, which is shared by the first and second DC paths and is configured to differentially amplify the first and second DC components. In an embodiment, the first and second DC paths include respective first and second voltage sources, which are configured to set first and second inputs of the differential voltage amplifier to respective DC voltage levels.

In an example embodiment, the first and second voltage sources are connected with opposite polarities to the first and second inputs of the differential voltage amplifier. In a disclosed embodiment, the TIA further includes control circuitry that is configured to adapt respective voltages of the first and second voltage sources, so as to minimize an average of the output voltage signal. In an alternative embodiment, the first and second DC paths include respective first and second single-ended voltage amplifiers configured to amplify the first and second DC components.

In some embodiments, the first input terminal is connected via a first bias resistor to a supply voltage, and the second input terminal is connected via a second bias resistor to ground. In an embodiment, resistances of the first and second bias resistors are externally programmable.

There is additionally provided, in accordance with an embodiment of the present invention, a method for amplification including receiving an input current signal differentially in first and second input terminals. Using a first amplification circuit, which includes a first Alternating-Current (AC) path and a first Direct-Current (DC) path, respective first AC and DC components of the input current signal flowing via the first input terminal are amplified in parallel, and the amplified first AC and DC components are summed using a first combiner. Using a second amplification circuit, which includes a second AC path and a second DC path, respective second AC and DC components of the input current signal flowing via the second input terminal are amplified in parallel, and the amplified second AC and DC components are summed using a first combiner. An output voltage signal formed between outputs of the first and second combiners is generated.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved TIA configurations. Although the embodiments described herein refer mainly to TIAs used for amplifying the outputs of light-sensitive PIN diodes in optoelectronic devices, the disclosed solutions are applicable to any other suitable type of TIA for use in any other suitable application.

In some embodiments described herein, a TIA comprises two parallel amplification circuits that differentially amplify the current of a PIN diode. In each of the two amplification circuits, the input current signal is split into an Alternating-Current (AC) component that is amplified by an AC path, and a Direct-Current (DC) component that is amplified by a separate DC path. Each of the two amplification circuits further comprises a combiner that sums the amplified AC and DC components. The voltage signal formed between the outputs of the two combiners is provided as the TIA output.

Typically, the AC path and the DC path in each of the two amplification circuits are gain-matched to one another. In an embodiment, the TIA comprises a differential voltage amplifier that is shared by the DC paths of the two amplification circuits, and differentially amplifies the DC components of the two amplification circuits. In an embodiment, each of the two DC paths comprises a respective voltage source, which may be set to half the supply voltage and is connected to the respective input of the differential voltage amplifier.

In some embodiments, the TIA is not entirely symmetrical. One deviation from symmetry is in the voltage sources, which are connected with opposite polarities to the respective inputs of the differential voltage amplifier. Another asymmetry is in the DC biasing of the input terminals: In one amplification circuit the input terminal is connected via a biasing resistor to the supply voltage, whereas in the other amplification circuit the input terminal is connected via a biasing resistor to ground.

The disclosed TIA has a differential configuration that is highly effective in suppressing common mode noise and common mode interference. Each half of the differential TIA has separate AC and DC amplification paths that together achieve very large bandwidth. Moreover, the TIA applies a high bias voltage across the PIN diode, thereby achieving high sensitivity.

TIA Circuit Description

Figure 1:
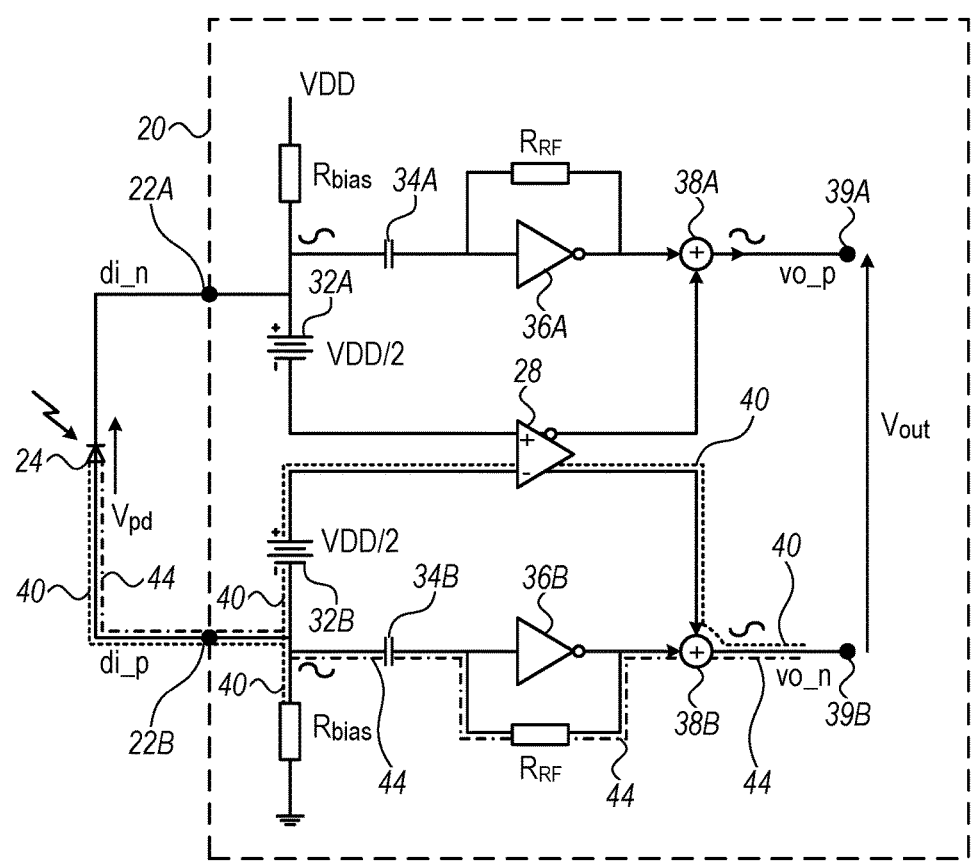
FIGS. 1 and 2 are circuit diagrams of broadband differential Trans-Impedance Amplifiers (TIAs), in accordance with embodiments of the present invention.

FIG. 1 is a circuit diagram of a broadband differential Trans-Impedance Amplifier (TIA) 20, in accordance with an embodiment of the present invention. In the present example, TIA 20 is used for amplifying the current of a light-sensitive PIN diode 24 (referred to herein as "input current signal"). This sort of configuration can be used, for example, in an optoelectronic receiver or interface of an optical communication system.

TIA 20 comprises two input terminals 22A and 22B for receiving the input current signal from PIN diode 24. The voltage across diode 24 is denoted $V_{pd}$. TIA 20 further comprises two output terminals 39A and 39B for outputting a differential output voltage signal denoted $V_{out}$. The currents at input terminals 22A and 22B are denoted di_n and di_p, respectively. The voltages at output terminals 39A and 39B are denoted vo_p and vo_n, respectively. Note that in the present example, although not necessarily, the output voltage $V_{out}$ has the same polarity relative to the input current, i.e., if the input current increases, so will $V_{out}$.

Input terminal 22A is connected to a first amplification circuit, shown at the top half of the figure. The first amplification circuit comprises a biasing resistor $R_{bias}$, a capacitor 34A, an inverting voltage amplifier 36A, a resistor $R_{RF}$, a voltage source 32A and a voltage combiner 38A. The output of combiner 38A (denoted vo_p) is output on output terminal 39A.

Input terminal 22B is connected to a second amplification circuit, shown at the bottom half of the figure. The second amplification circuit comprises another biasing resistor $R_{bias}$, a capacitor 34B, an inverting voltage amplifier 36B, another resistor $R_{RF}$, a voltage source 32B and a voltage combiner 38B. The output of combiner 38B (denoted vo_n) is output on output terminal 39B.

In addition, TIA 20 comprises a differential voltage amplifier 28 that is shared by both amplification circuits.

Each of the two amplification circuits comprises a respective DC path 40 and a respective AC path 44. (Paths 40 and 44 are plotted in the figure only for the bottom amplification circuit, for clarity.)

In the first amplification circuit, the DC path traverses input terminal 22A, voltage source 32A, differential amplifier 28, and combiner 38A. The AC path in the first amplification circuit traverses input terminal 22A, capacitor 34A, resistor $R_{RF}$, and combiner 38A.

In the second amplification circuit, the DC path traverses input terminal 22B, voltage source 32B, differential amplifier 28, and combiner 38B. The AC path in the second amplification circuit traverses input terminal 22B, capacitor 34B, resistor $R_{RF}$, and combiner 38B.

By splitting the input current signal into an AC path (that amplifies the AC component) and a DC path (that amplifies the DC component), the amplification circuits achieve a very broadband and flat frequency response. The TIA as a whole can be regarded as DC-coupled. Typically, the performance of the amplification circuit is not sensitive to the exact value of the "crossing frequency" between the AC part and the DC part (roughly corresponding to the lowest frequency of the AC component and the highest frequency of the DC component).

On the other hand, it is typically important that, in each of the two amplification circuits, the gain of the AC path will match the gain of the DC path. In other words, the AC component and the corresponding DC component at the inputs to a given combiner (38A or 38B) should be amplified by substantially the same gain. In an embodiment, this gain matching condition is satisfied by setting the gain of voltage amplifier 28 to the ratio between the resistances of $R_{RF}$ and $R_{bias}$, i.e., GAIN=$R_{RF}/R_{bias}$. For best performance (although not necessarily), all four paths (two DC paths and two AC paths) may be gain-matched to one another.

Typically, the input impedance of TIA 20 at DC is twice the resistance of $R_{bias}$ (in one example the resistance of $R_{bias}$ is on the order of 3 KΩ), whereas at AC the input impedance of TIA 20 is twice the input impedance of the AC path (in one example the input impedance of the AC path is on the order of 50Ω).

As can be seen in the figure, TIA 20 is not entirely symmetrical, i.e., the two amplification circuits are not completely identical. One asymmetry is the opposite polarities of voltage sources 32A and 32B. In the top amplification circuit, the negative terminal of the voltage source is connected to amplifier 28, and the positive terminal is connected to the node of the input terminal and $R_{bias}$. In the bottom amplification circuit, the voltage source polarity is reversed: The positive terminal of the voltage source is connected to amplifier 28, and the negative terminal is connected to the node of the input terminal and $R_{bias}$. Another asymmetry is in the DC biasing of the input terminals. In the top amplification circuit, the input terminal is connected via $R_{bias}$ to the supply voltage VDD. In the bottom amplification circuit, on the other hand, the input terminal is connected via $R_{bias}$ to ground.

The asymmetries described above do not degrade the common-mode suppression performance of TIA 20. On the other hand, with this asymmetrical configuration, under ideal conditions, the two inputs of amplifier 28 are biased to the same DC bias voltage which may be VDD/2. As a result, the average amplitude of the differential signal amplified by amplifier 28 is small. Moreover, the asymmetrical configuration maximizes the bias voltage $V_{pd}$ across PIN diode 24, thereby achieving high PIN-diode sensitivity. Furthermore, with this configuration, noise on the supply voltage VDD, and/or ground noise, appears as a common-mode signal, and is therefore suppressed.

In some embodiments, TIA 20 comprises control circuitry (not shown in the figure) that adjusts the voltages of voltage sources 32A and/or 32B adaptively during normal operation of the TIA. Typically, the control circuitry adjusts the voltages of voltage sources 32A and/or 32B so as to minimize the average value of $V_{out}$. Under ideal conditions, the control circuitry is able to reduce the average value of $V_{out}$ to zero. This minimization suppresses the DC offset effect that the average current in PIN diode 24 generates between the inputs of amplifier 28. When the DC offset is minimized, $V_{out}$ reflects the modulation current (as opposed to average DC current) of the PIN diode. Typically, the resulting voltages of voltage sources 32A and 32B is inversely related to the average PIN-diode current. When the average PIN-diode current is zero, the voltages of voltage sources 32A and 32B converge to VDD/2.

In one example embodiment, TIA 20 is designed to amplify an optical signal having a bit rate of 56 Gb/s. In this example, capacitors 34A and 34B have a capacitance of ~5 pF, resistors $R_{bias}$ have a resistance of ~3 KΩ, resistors $R_{RF}$ have a resistance of ~1 KΩ, the input impedance of the AC paths is ~50, and the cross-over frequency between the AC path and the DC path is ~10 MHz. The numerical values above are given purely by way of example. In alternative embodiments, any other suitable numerical values can be used. In some embodiments, the resistances of resistors $R_{bias}$ are externally programmable. This configurability enables accurate control over the bias voltage $V_{pd}$ across PIN diode 24.

The configuration of TIA 20 shown in FIG. 1 is an example configuration that is depicted purely for the sake of conceptual clarity. In alternative embodiments, any other suitable TIA configuration can be used. For example, instead of differential amplifier 28, the TIA may be implemented using two single-ended voltage amplifiers. TIA 20 may be implemented, for example, using discrete components.

Figure 2:
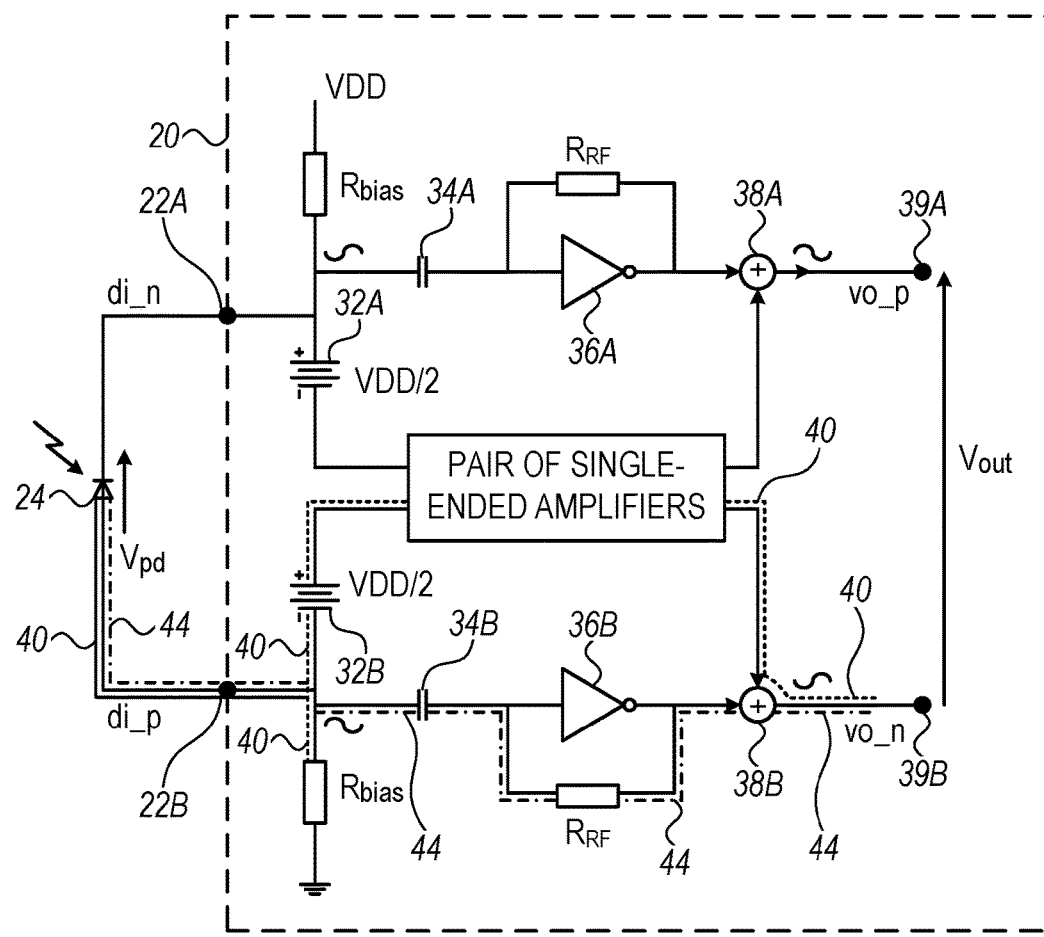

FIG. 2 is a circuit diagram of a broadband differential Trans-Impedance Amplifier (TIA), in accordance with an alternative embodiment of the present invention. In this example, instead of differential amplifier 28 of FIG. 1, the TIA is implemented using a pair of single-ended voltage amplifiers.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A Trans-Impedance Amplifier (TIA), comprising:
 first and second input terminals, for differentially receiving an input current signal;
 a first amplification circuit, which comprises a first Alternating-Current (AC) path and a first Direct-Current (DC) path that are configured to amplify in parallel respective first AC and DC components of the input current signal flowing via the first input terminal, and a first combiner configured to sum the amplified first AC and DC components;
 a second amplification circuit, which comprises a second AC path and a second DC path that are configured to amplify in parallel respective second AC and DC components of the input current signal flowing via the second input terminal, and a second combiner configured to sum the amplified second AC and DC components; and
 first and second output terminals, for outputting an output voltage signal formed between outputs of the first and second combiners.

2. The TIA according to claim 1, wherein the first AC path and the first DC path are gain-matched to one another, and the second AC path and the second DC path are gain-matched to one another.

3. The TIA according to claim 1, and comprising a differential voltage amplifier, which is shared by the first and second DC paths and is configured to differentially amplify the first and second DC components.

4. The TIA according to claim 3, wherein the first and second DC paths comprise respective first and second voltage sources, which are configured to set first and second inputs of the differential voltage amplifier to respective DC voltage levels.

5. The TIA according to claim 4, wherein the first and second voltage sources are connected with opposite polarities to the first and second inputs of the differential voltage amplifier.

6. The TIA according to claim 4, and comprising control circuitry that is configured to adapt respective voltages of the first and second voltage sources, so as to minimize an average of the output voltage signal.

7. The TIA according to claim 1, wherein the first and second DC paths comprise respective first and second single-ended voltage amplifiers configured to amplify the first and second DC components.

8. The TIA according to claim 1, wherein the first input terminal is connected via a first bias resistor to a supply voltage, and the second input terminal is connected via a second bias resistor to ground.

9. The TIA according to claim 8, wherein resistances of the first and second bias resistors are externally programmable.

10. A method for amplification, comprising:
 receiving an input current signal differentially in first and second input terminals;
 using a first amplification circuit, which comprises a first Alternating-Current (AC) path and a first Direct-Current (DC) path, amplifying in parallel respective first AC and DC components of the input current signal flowing via the first input terminal, and summing the amplified first AC and DC components using a first combiner;
 using a second amplification circuit, which comprises a second AC path and a second DC path, amplifying in parallel respective second AC and DC components of the input current signal flowing via the second input terminal, and summing the amplified second AC and DC components using a second combiner; and
 generating an output voltage signal formed between outputs of the first and second combiners.

11. The method according to claim 10, wherein the first AC path and the first DC path are gain-matched to one another, and the second AC path and the second DC path are gain-matched to one another.

12. The method according to claim 10, wherein amplifying the DC components comprises differentially amplifying the first and second DC components by a differential voltage amplifier that is shared by the first and second DC paths.

13. The method according to claim 12, and comprising setting first and second inputs of the differential voltage amplifier to respective DC voltage levels by respective first and second voltage sources.

14. The method according to claim 13, wherein the first and second voltage sources are connected with opposite polarities to the first and second inputs of the differential voltage amplifier.

15. The method according to claim 13, and comprising adapting respective voltages of the first and second voltage sources, so as to minimize an average of the output voltage signal.

16. The method according to claim 10, wherein amplifying the DC components comprises amplifying the first and second DC components by respective first and second single-ended voltage amplifiers.

17. The method according to claim 10, wherein the first input terminal is connected via a first bias resistor to a supply voltage, and the second input terminal is connected via a second bias resistor to ground.

18. The method according to claim 17, and comprising externally programming resistances of the first and second bias resistors.

\* \* \* \* \*